United States Patent
Mejia-Silva et al.

(10) Patent No.: US 11,296,140 B2
(45) Date of Patent: Apr. 5, 2022

(54) METHOD FOR THE INTEGRATION OF MONOLITHIC THIN FILM RADIATION DETECTOR SYSTEMS

(71) Applicants: Board of Regents, The University of Texas System, Austin, TX (US); Nanoholdings LLC, Rowayton, CT (US)

(72) Inventors: Jesus I. Mejia-Silva, Frisco, TX (US); Manuel Quevedo-Lopez, Richardson, TX (US); Bruce E. Gnade, Lewisville, TX (US); Carlos Hugo Avila Avendano, Richardson, TX (US); Bhabendra K. Pradhan, Rowayton, CT (US)

(73) Assignee: BOARD OF REGENTS, THE UNIVERSITY OF TEXAS SYSTEM, Austin, TX (US)

( * ) Notice: Subject to any disclaimer, the term of this patent is extended or adjusted under 35 U.S.C. 154(b) by 297 days.

(21) Appl. No.: 16/605,534

(22) PCT Filed: Apr. 13, 2018

(86) PCT No.: PCT/US2018/027598
§ 371 (c)(1),
(2) Date: Oct. 16, 2019

(87) PCT Pub. No.: WO2018/194934
PCT Pub. Date: Oct. 25, 2018

(65) Prior Publication Data
US 2020/0127038 A1    Apr. 23, 2020

Related U.S. Application Data

(60) Provisional application No. 62/486,634, filed on Apr. 18, 2017.

(51) Int. Cl.
*G01T 1/20* (2006.01)
*H01L 27/146* (2006.01)
(Continued)

(52) U.S. Cl.
CPC ...... *H01L 27/14663* (2013.01); *G01T 1/2018* (2013.01); *H01L 27/1461* (2013.01);
(Continued)

(58) Field of Classification Search
CPC .......... H01L 27/14663; H01L 27/1461; H01L 27/14616; H01L 27/14689;
(Continued)

(56) References Cited

U.S. PATENT DOCUMENTS

| 5,480,810 A | 1/1996 | Wei et al. |
| 2007/0258008 A1 | 11/2007 | Kameshima et al. |

FOREIGN PATENT DOCUMENTS

| WO | 2004/019123 | 8/2003 | |
| WO | WO-2008129433 A2 * | 10/2008 | ......... H01L 31/1804 |

OTHER PUBLICATIONS

Antonuk et al., "Exploration of the potential performance of polycrystalline silicon-based active matrix flat-panel imagers incorporating active pixel sensor architectures", Proceedings of SPIE, vol. 6913, Mar. 6, 2008, Abstract (one page).
(Continued)

*Primary Examiner* — Kiho Kim
(74) *Attorney, Agent, or Firm* — Saliwanchik, Lloyd & Eisenschenk

(57) ABSTRACT

A thin film radiation detection device includes a photosensitive p-n diode, a polysilicon thin film transistor (TFT), a radiation detection layer, and a substrate. The photosensitive p-n diode and the TFT are formed on the substrate. The radiation detection layer is formed above the substrate and receives multiple radiations. The photosensitive p-n diode
(Continued)

receives a conversion output signal from the radiation detection layer and generates a detector signal. The TFT generates an amplified signal based on the detector signal.

20 Claims, 2 Drawing Sheets

(51) Int. Cl.
*H01L 29/786* (2006.01)
*H01L 31/0392* (2006.01)

(52) U.S. Cl.
CPC .. *H01L 27/14616* (2013.01); *H01L 27/14689* (2013.01); *H01L 27/14692* (2013.01); *H01L 27/14696* (2013.01); *H01L 29/78675* (2013.01); *H01L 31/03925* (2013.01); *H01L 31/03926* (2013.01)

(58) Field of Classification Search
CPC ......... H01L 27/14692; H01L 27/14696; H01L 29/78675; H01L 31/03925; H01L 31/03926; H01L 31/115; H01L 27/14658; H01L 31/0224; H01L 31/109; G01T 1/2018
See application file for complete search history.

(56) References Cited

OTHER PUBLICATIONS

International Search Report and Written Opinion, PCT International Application No. PCT/US2018/027598, PCT/ISA/210, PCT/ISA/220, PCT/ISA/237, dated Sep. 27, 2018.

\* cited by examiner

METHOD FOR THE INTEGRATION OF MONOLITHIC THIN FILM RADIATION DETECTOR SYSTEMS

CROSS REFERENCE TO RELATED APPLICATIONS

This application is a national stage application of International Patent Application No. PCT/US2018/027598, filed Apr. 13, 2018, which claims the benefit of U.S. Provisional Application Ser. No. 62/486,634, filed Apr. 18, 2017, both of which are hereby incorporated by reference in their entireties, including any figures, tables, and drawings.

BACKGROUND

The present invention relates generally to radiation detection systems, particularly to radiation detection devices for simultaneously detecting multiple radiations.

Radiation detection systems are utilized for detection, identification, and tracking of particles in radiations that are generated due to nuclear decay and due to reactions in particle accelerators. Examples of radiation include alpha radiation, beta radiation, gamma rays, X-rays and neutrons. Radiation detection systems are typically employed at airports, border areas, hospitals, laboratories, nuclear power plants, particle accelerators and locations of the like for security purposes. Generally, the radiation detection systems include an array of radiation detection devices. Typically, a radiation detection device includes a scintillator, a photosensitive receiver, and a preamplification circuit. The scintillator receives multiple radiations and generates light radiations of frequencies corresponding to the incident radiations.

The photosensitive receiver in a commercially available radiation detection device includes at least one of a p-n photodiode and a PIN photodiode. Typically, the photosensitive receiver in the commercially available radiation detection device is not fabricated on the same substrate as the preamplification circuit and includes commercially off-the-shelf p-n or PIN photodiodes. U.S. Patent Application Publication No. 2016/0003953 discloses one such radiation detection device. The disclosed radiation detection device is a thin film transistor (TFT) radiation detection device that includes the photodiode OPF480 as the photosensitive receiver. The TFT radiation detection device also includes an amplification element for amplification of incident radiation. Commercially off-the-shelf photodiodes such as OPF480, which are manufactured in standard sizes, limit the radiation detection area of the photosensitive receiver to the area of the photodiode. Thus, a large number of photosensitive receivers are required to increase the radiation detection area of the TFT radiation detection device. This significantly increases the cost of the TFT radiation detection device. Further, the TFT radiation detection device is bulky because the TFT radiation detection device uses commercially off-the-shelf photodiode OPF 480 as the photosensitive receiver. Moreover, the fabrication process for manufacturing the TFT radiation detection device using OPF 480 as the photosensitive receiver is complicated, leading to inaccuracies and manufacturing defects in the TFT radiation detection device.

The amplification element is fabricated using TFTs. Generally, the performance of a TFT degrades as the stress time of the TFT increases. Stress time is the time duration for which the TFT is continuously operating. With an increase in the stress time, electrical parameters such as electron mobility and threshold voltage of the TFT degrade. Further, the amplification element is fabricated using one of Indium gallium zinc oxide (IGZO) and amorphous silicon (a-Si). IGZO, a-Si and Cadmium sulfide (CdS) are generally used to fabricate commercially available TFTs. TFTs fabricated using IGZO, a-Si and CdS show further degradation in the aforementioned electrical parameters of the TFTs with increase in the stress time. Thus, the stability and accuracy of the amplification element is compromised, consequently, compromising the stability and accuracy of the TFT radiation detection device.

BRIEF SUMMARY

In view of the above, it would be advantageous to have a lightweight radiation detection device that has a large radiation detection area, is stable over a large stress time, has an easy fabrication process, and is cost effective.

Embodiments of the subject invention include novel and advantageous radiation detection devices and methods of fabricating and using the same. In an embodiment, a thin film radiation detection device can include a photosensitive p-n diode, a thin film transistor (TFT), a radiation detection layer, and a substrate. The radiation detection layer can be formed above the substrate and can receive multiple radiations (or types of radiation). The photosensitive p-n diode can receive a conversion output signal from the radiation detection layer and generate a detector signal. The TFT can generate an amplified signal based on the detector signal.

BRIEF DESCRIPTION OF DRAWINGS

The following detailed description of the preferred embodiments of the present invention will be better understood when read in conjunction with the appended drawings.

The present invention is illustrated by way of example, and not limited by the accompanying figures, in which like references indicated similar elements.

DETAILED DESCRIPTION

Figure 1:
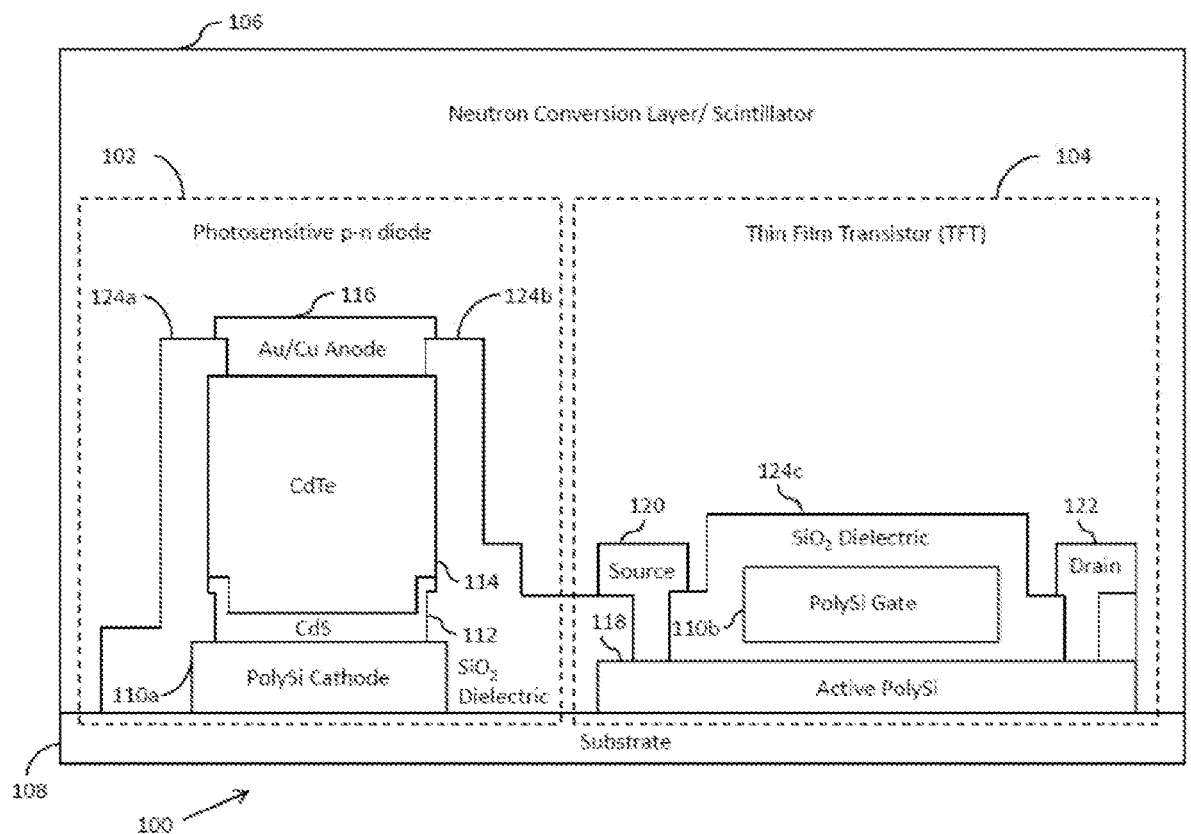
FIG. 1 is a sectional side view of a photosensitive p-n diode and a thin film transistor (TFT) of a radiation detection device, in accordance with an embodiment of the present invention.
Figure 2:
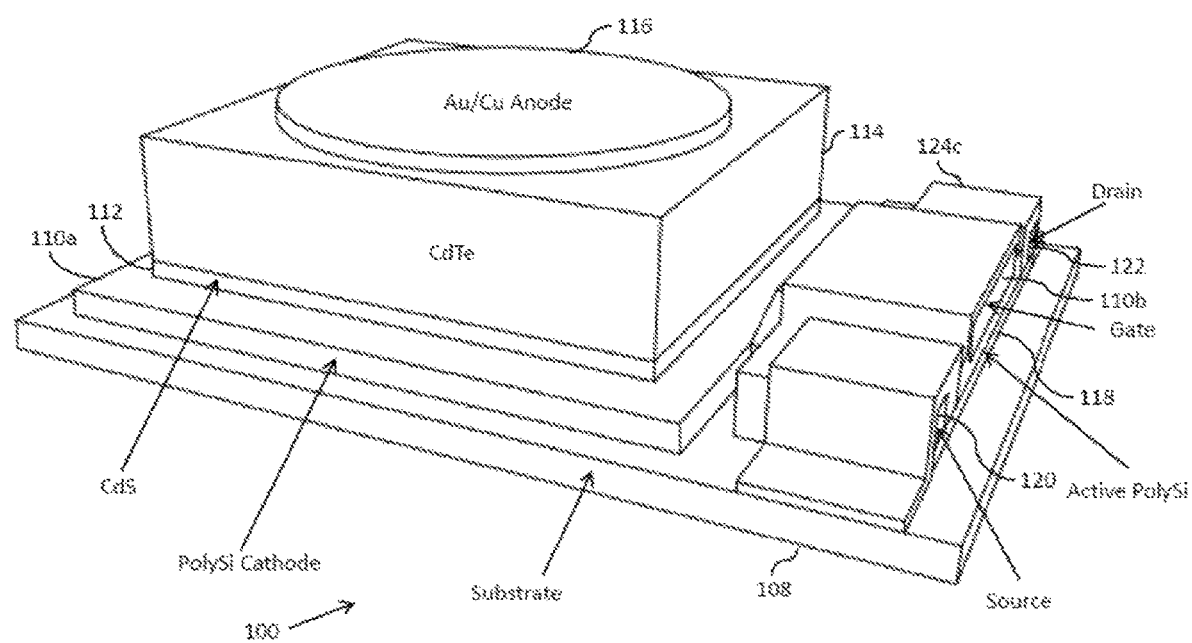
FIG. 2 illustrates a perspective view of the radiation detection device of FIG. 1, in accordance with an embodiment of the present invention.

The detailed description, including description of the appended drawings, is intended as a description of the currently preferred embodiments of the present invention, and is not intended to represent the only form in which the present invention may be practiced. It is to be understood that the same or equivalent functions may be accomplished by different embodiments that are intended to be encompassed within the spirit and scope of the present invention.

An object of the present invention is to provide a radiation detection device for detecting multiple radiations.

In one embodiment of the present invention, a radiation detection device is provided. The radiation detection device includes a substrate, first and second portions of the first polysilicon layer, a second polysilicon layer, n-type and p-type layers, a metal layer, first and second layers, and a radiation detection layer. The first portion of the first polysilicon layer, the n-type and p-type layers, and the metal layer form a photosensitive p-n diode. The second polysilicon layer, the second portion of the first polysilicon layer, and the first and second layers form a thin film transistor (TFT). The first portion of the first polysilicon layer is formed on the substrate. The first portion of the first polysilicon layer is a cathode of the photosensitive p-n diode. The n-type layer is formed on the first portion of the first polysilicon layer. The p-type layer is formed on the n-type layer. The metal layer is formed on the p-type layer. The metal layer is an anode of the photosensitive p-n diode. The p-type and n-type layers form a p-n junction of the photosensitive p-n diode. The second polysilicon layer is formed on the substrate. The second polysilicon layer is an active region of the TFT. The second portion of the first polysilicon layer is formed above the second polysilicon layer. The second portion of the first polysilicon layer is a gate electrode of the TFT. The first layer, which is a source electrode of the TFT, is formed on a first region of the second polysilicon layer. The second layer, which is a drain electrode of the TFT, is formed on a second region of the second polysilicon layer. The radiation detection layer receives a plurality of radiations, and generates a conversion output signal. The photosensitive p-n diode receives the conversion output signal, and generates a detector signal. The TFT receives the detector signal for generating an amplified signal.

In another embodiment of the present invention, a method for fabricating a radiation detection device is provided. The radiation detection device includes a substrate, first and second portions of a first polysilicon layer, a second polysilicon layer, n-type and p-type layers, a metal layer, first and second layers, and a radiation detection layer. The method includes forming the first portion of the first polysilicon layer and the second polysilicon layer on the substrate. The first portion of the first polysilicon layer is a cathode of a photosensitive p-n diode. The second polysilicon layer is an active polysilicon island of a thin film transistor (TFT). The method further includes forming the n-type layer on the first portion of the first polysilicon layer. The method further includes forming the p-type layer on the n-type layer, and forming the metal layer on the p-type layer. The metal layer is an anode of the photosensitive p-n diode. Further, the p-type and n-type layers form a p-n junction of the photosensitive p-n diode. The method further includes forming the second portion of the first polysilicon layer above the second polysilicon layer. The second portion of the first polysilicon layer is a gate electrode of the TFT. Subsequently, the first layer is formed on a first region of the second polysilicon layer. The first layer is a source electrode of the TFT. The method further includes forming the second layer on a second region of the second polysilicon layer. The second layer is a drain electrode of the TFT. Further, the method includes forming the radiation detection layer above the substrate, which includes at least one of a scintillation layer and a neutron conversion layer. The radiation detection layer receives a plurality of radiations, and generates a conversion output signal. The photosensitive p-n diode receives the conversion output signal, and generates a detector signal. Further, the TFT receives the detector signal, and generates an amplified signal.

In many embodiments a radiation detection device can include a substrate, first and second portions of a first polysilicon layer, a second polysilicon layer, n-type and p-type layers, a metal layer, first and second layers, and a radiation detection layer. The first portion of the first polysilicon layer, the p-type and n-type layers, and the metal layer form a photosensitive p-n diode. The second portion of the first polysilicon layer, the second polysilicon layer, and the first and second layers form a thin film transistor (TFT). The first portion of the first polysilicon layer is formed on the substrate. The first portion of the first polysilicon layer is a cathode of the photosensitive p-n diode. The n-type layer is formed on the first portion of the first polysilicon layer. The n-type layer includes Cadmium sulfide. The p-type layer is formed on the n-type layer. The p-type layer includes Cadmium telluride. The n-type and p-type layers form a p-n junction of the photosensitive p-n diode. The first portion of the first polysilicon layer and the metal layer are cathode and anode of the photosensitive p-n diode, respectively. The second polysilicon layer is formed on the substrate. The second polysilicon layer is an active region (also referred to as "active polysilicon island") of the TFT. The second portion of the first polysilicon layer is formed above the second polysilicon layer. The second portion of the first polysilicon layer is a gate electrode of the TFT. The first layer is formed on a first region of the second polysilicon layer. The first layer is a source electrode of the TFT. The second layer is formed on a second region of the second polysilicon layer. The second layer is a drain electrode of the TFT. The TFT also includes a silicon dioxide dielectric layer deposited on the second polysilicon layer. The radiation detection layer is formed above the substrate. The radiation detection layer includes at least one of a scintillation layer and a neutron conversion layer.

The photosensitive p-n diode and the TFT are fabricated on the same substrate. Hence, the process of fabricating an array of the radiation detection devices on the same substrate is less complicated as compared to fabricating an array of conventional radiation detection devices with discrete photosensitive components. Moreover, the radiation detection device is not as bulky as the commercially available radiation detection devices. Further, polysilicon is used to fabricate the radiation detection device. TFTs fabricated using polysilicon exhibit less degradation of electrical parameters such as mobility and threshold voltage for an increased stress time. Hence, the radiation detection device does not compromise on the aforementioned parameters, maintaining the accuracy and stability thereof.

Referring now to FIG. 1, a radiation detection device 100 that includes a photosensitive p-n diode 102 and a thin film transistor (TFT) 104, in accordance with an embodiment of the present invention is shown. The radiation detection device 100 can further include a preamplification circuit (not shown), a signal shaping circuit (not shown), a radiation detection layer 106, and a substrate 108. The preamplification circuit includes the TFT 104. An array of multiple radiation detection devices 100 forms a radiation detection system. Radiation detection systems are typically employed at airports, border areas, hospitals, laboratories, nuclear power plants, particle accelerators and locations of the like for security purposes.

The photosensitive p-n diode 102 includes a first portion of a first polysilicon layer 110a, n-type and p-type layers 112 and 114, and a metal layer 116. The first portion of the first polysilicon layer 110a is formed on the substrate 108. The first portion of the first polysilicon layer 110a is a cathode of the photosensitive p-n diode 102. The substrate 108 includes at least one of Polyethylene naphthalate (PEN), Polyethylene terephthalate (PET), flexible Aluminum foil, flexible stainless steel sheet, and flexible glass. The n-type layer 112 includes Cadmium sulfide (CdS). Subsequently, the p-type layer 114 is formed on the n-type layer 112. The p-type layer 114 includes Cadmium telluride (CdTe). The p-type and n-type layers 114 and 112 form a p-n junction of the photosensitive p-n diode 102. The metal layer 116 is formed on the p-type layer 114. The metal layer 116 is an anode of the photosensitive p-n diode 102. The metal layer 116 includes at least one of copper (Cu) and gold (Au).

In one embodiment of the present invention, the first portion of the first polysilicon layer 110a is patterned on the substrate 108 using the process of photolithography. The n-type layer 112 that includes CdS is deposited on the first portion of the first polysilicon layer 110a by using the process of chemical bath deposition (CBD). Subsequently, the CdS is patterned to form the n-type layer 112 of the photosensitive p-n diode 102 using photolithography. The p-type layer 114, which includes CdTe is deposited on the n-type layer 112 by using the process of closed space sublimation (CSS). The CdTe deposits preferentially only on the n-type layer 112 forming the p-n junction of the photosensitive p-n junction diode 102. The metal layer 116, which is the anode of the photosensitive p-n junction diode 102 is typically connected to ground terminal.

The TFT 104 includes a second polysilicon layer 118, a second portion of the first polysilicon layer 110b, and first and second layers 120 and 122. The second polysilicon layer 118 is formed on the substrate 108. The second polysilicon layer 118 is an active region of the TFT 104. The second portion of the first polysilicon layer 110b is formed above the second polysilicon layer 118. It will be understood by a person skilled in the art that the first and second portions of the first polysilicon layer 110a and 110b are deposited above the substrate 108 and the second polysilicon layer 118, respectively, subsequent to the formation of the second polysilicon layer 118 on the substrate 108. The second portion of the first polysilicon layer 110b is a gate electrode of the TFT 104. Further, the first layer 120 is formed on a first region of the second polysilicon layer 118. The first layer 120 is a source electrode of the TFT 104. The second layer 122 is formed on a second region of the second polysilicon layer 118. The second layer 122 is a drain electrode of the TFT 104. Further, the first and second layers 120 and 122 include doped polycrystalline silicon. The doped polycrystalline silicon includes at least one of p-type doping and n-type doping.

The photosensitive p-n diode 102 and the TFT 104 include first through third silicon dioxide dielectric layers 124a-124c (collectively referred to as "silicon dioxide dielectric layer" 124). The first and second silicon dioxide dielectric layers 124a and 124b are deposited on the substrate 108 and are in contact with the first portion of the first polysilicon layer 110a, the n-type layer 112, the p-type layer 114, and the metal layer 116. The third silicon dioxide dielectric layer 124c is deposited on the second polysilicon layer 118. Further, first, second, and top portions of the second portion of the first polysilicon layer 110b are in contact with the third silicon dioxide dielectric layer 124c.

Fabrication of the TFT 104 can be achieved using various processes. Low temperature polysilicon (LTPS) may be used for fabricating the TFT 104. In one embodiment of the present invention, polysilicon is deposited on the substrate 108 by the process of low pressure chemical vapor deposition (LPCVD). Subsequently, the polysilicon undergoes crystallization annealing in nitrogen. Further, the polysilicon undergoes patterning to form the second polysilicon layer 118 by the process of chlorine-based dry etching. For forming the gate, source and drain electrodes of the TFT 104, silicon dioxide dielectric layer 124 and polysilicon are deposited above the second polysilicon layer 118 by using the process of LPCVD. Further, the silicon dioxide dielectric layer 124 and the polysilicon undergo patterning to form the gate, source and drain electrodes, using the process of chlorine-based dry etching.

The radiation detection layer 106 of the radiation detection device 100 receives multiple radiations including alpha radiation, beta radiation, gamma radiation, X-rays, and neutron particles. The radiation detection 106 layer includes at least one of a scintillation layer and a neutron conversion layer. The radiation detection layer 106 may be designed to include an X-ray scintillator or a gamma scintillator based on the type of radiation received by the radiation detection device 100. Since scintillators absorb only ionized radiation, scintillators are unable to detect neutrons. Hence, the radiation detection layer 106 may be designed to include the neutron conversion layer to detect the neutron particles in the multiple radiations. Based on the received multiple radiations, the radiation detection layer 106 generates light radiation corresponding to a conversion output signal.

Typically, the neutron conversion layer of the radiation detection layer 106 includes nanoparticles of neutron sensitive materials such as Boron ($^{10}$B) and Gadolinium ($^{157}$Gd) in their carbide, oxide, nitride, and metallic forms. The neutron conversion layer receives the multiple radiations and generates corresponding ionizing radiations. The ionizing radiations include at least one of beta particles, gamma rays, and alpha particles. Further, the scintillation layer of the radiation detection layer 106 includes either sodium iodide doped with thallium NaI (TI), Cesium iodide doped with thallium CsI (TI), sodium activated cesium iodide CsI (Na) or anthracene.

In one embodiment, the radiation detection layer 106 receives multiple radiations including alpha radiation, beta radiation, gamma radiation, X-rays, and neutron particles. The radiation detection layer 106 generates the conversion output signal corresponding to a radiation of the multiple radiations. The conversion output signal is a light radiation. The photosensitive p-n diode 102 receives the conversion output signal from the radiation detection layer 106. The photosensitive p-n diode 102 subsequently generates a detector signal. The detector signal is a voltage across the first portion of the first polysilicon layer 110a and the metal layer 116. The second portion of the first polysilicon layer 110b receives the detector signal. The TFT 104 generates an amplified signal based on the detector signal.

The radiation detection device 100 is implemented as a large area radiation detection device and is cost effective. It is easy to fabricate the radiation detection device 100 that has the photosensitive p-n diode 102 and the TFT 104 integrated on the same substrate 108 unlike the conventional radiation detection device that uses discreet photosensitive receivers. Thus, the radiation detection device 100 has a monolithic structure. This reduces the cost of manufacturing the radiation detection device 100 and is less expensive as compared to the commercially off-the-shelf radiation detection devices. Further, the radiation detection device 100 is light weight, as the radiation detection device 100 does not use a discreet photosensitive receiver. Further, since the photosensitive p-n diode 102 and the TFT 104 are integrated on the same substrate 108, the radiation detection device 100 provides more power efficiency as compared to the commercially available radiation detection devices. In one embodiment, when the substrate 108 is flexible glass, an array of the radiation detection devices 100 may be integrated on the substrate 108 to form a system-on-glass (SOG) radiation detection system. Moreover, the radiation detection device 100 has a large radiation detection area as compared to a commercially available radiation detection device.

For successful functioning of the radiation detection device 100, it is essential that one of the n-type and p-type layers 112 and 114 has low doping concentration for creating a large depletion width in the photosensitive p-n diode 102. Further, it is required that the process of fabricating the photosensitive p-n junction diode 102 is suitable for fabricating thin film diodes of large area, facilitating the integration of the photosensitive p-n diode 102 and the TFT 104 on the same substrate 108. Moreover, the thickness of the n-type and p-type layers 112 and 114 is required to be controlled from tens of nanometers to several micrometers. CdS and CdTe satisfy the aforementioned criteria of the n-type and p-type layers 112 and 114. CdTe, used for fabricating the p-type layer 114, has low doping concentration to create a large depletion width. If the depletion width of the photosensitive p-n diode 102 is small, it leads to partial absorption of the energy of particles in the multiple radiations. The large depletion width results in a large area for completely absorbing the energy of the particles in the multiple radiations, subsequently generating more charge across the first portion of the first polysilicon layer 110a and the metal layer 116. Generation of more charge across the first polysilicon layer 110a and the metal layer 116 leads to a greater sensitivity of the radiation detection device 100 to the multiple radiations, hence improving the accuracy of the radiation detection device 100.

The accuracy of the radiation detection device 100 is typically affected by gamma radiation when radiation detection device 100 is employed for detecting neutrons in the multiple radiations. The gamma radiation may interfere with the radiation detection device 100, leading to a false positive detection of the neutrons by the radiation detection device. However, the use of the thin film technology to fabricate the preamplification circuit makes the preamplification circuit transparent to the gamma radiations i.e. the preamplification circuit does not absorb the gamma radiations. Hence, the radiation detection device 100 has high gamma rejection and the presence of gamma radiation in the multiple radiations does not affect the accuracy of the radiation detection device 100.

Further, multiple radiation detection devices 100 may be integrated on the substrate 108 as a pixelated array of radiation detection devices to form a radiation detection system. This is advantageous for applications that require large areas for radiation detection. The intercommunication of multiple radiation detection systems is used for determining the location of the source of the multiple radiations. For example, in security applications, multiple hand held radiation detection systems are deployed. In a crowded area, the hand held radiation detection systems communicate with a control server for triangulating the location of a person or a vehicle carrying the source of the multiple radiations. The locations of the multiple radiation detection systems are used for precisely determining the location of the source of the multiple radiations. Further, in particle accelerators, the radiation detection system is used to track the trajectory of the particles for accurately determining the locations of particles generated because of particle collisions in the particle accelerators. The radiation detection system may also be used in radiation imaging for determining the trajectories of the particles in the particle accelerators.

Further, polysilicon cam be used to fabricate the TFT 104. Hence, unipolar or complementary metal oxide semiconductor field effect transistor (MOSFET) circuits can be fabricated with the radiation detection device 100. Typically, radiation detection devices are high performance devices. Implementing complementary MOSFET circuits with the radiation detection devices provides high speed and mobility that is necessary for the accurate functioning of the radiation detection devices. Moreover, the radiation detection device 100 is compatible with commercially available products employing radiation detection.

The subject invention includes, but is not limited to, the following exemplified embodiments.

Embodiment 1

A radiation detection device, comprising:

a first portion of a first polysilicon layer formed on a substrate, wherein the first portion of the first polysilicon layer is a cathode;

an n-type layer formed on the first portion of the first polysilicon layer;

a p-type layer formed on the n-type layer;

a metal layer formed on the p-type layer, wherein the metal layer is an anode;

a second polysilicon layer formed on the substrate;

a second portion of the first polysilicon layer formed above the second polysilicon layer;

a first layer formed on a first region of the second polysilicon layer;

a second layer formed on a second region of the second polysilicon layer; and a radiation detection layer formed above the substrate, wherein the radiation detection layer is configured to receive a plurality of radiations and generate a conversion output signal, wherein the photosensitive diode is configured to receive the conversion output signal and generate a detector signal, and wherein the transistor is configured to receive the detector signal and generate an amplified signal.

Embodiment 2

The radiation detection device according to embodiment 1, wherein the second polysilicon layer is an active polysilicon island.

Embodiment 3

The radiation detection device according to any of embodiments 1-2, wherein the second portion of the first polysilicon layer is a gate electrode.

Embodiment 4

The radiation detection device according to any of embodiments 1-3, wherein the first layer is a source electrode.

Embodiment 5

The radiation detection device according to any of embodiments 1-4, wherein the second layer is a drain electrode.

Embodiment 6

The radiation detection device according to any of embodiments 1-5, wherein the active polysilicon island, and the gate, source, and drain electrodes form a transistor.

Embodiment 7

The radiation detection device according to any of embodiments 1-6, wherein the radiation detection layer is configured to receive a plurality of radiations and generate a conversion output signal.

Embodiment 8

The radiation detection device according to any of embodiments 1-7, wherein the photosensitive diode is configured to receive the conversion output signal and generate a detector signal.

Embodiment 9

The radiation detection device according to any of embodiments 1-8, wherein the transistor is configured to receive the detector signal and generate an amplified signal.

Embodiment 10

The radiation detection device according to any of embodiments 1-9, wherein the n-type and p-type layers, the cathode, and the anode form a photosensitive diode.

Embodiment 11

The radiation detection device according to any of embodiments 1-10, wherein the substrate includes at least one of polyethylene naphthalate, polyethylene terephthalate, a flexible aluminum foil, a flexible stainless steel sheet, and flexible glass.

Embodiment 12

The radiation detection device according to any of embodiments 1-11, wherein the n-type layer includes cadmium sulfide.

Embodiment 13

The radiation detection device according to any of embodiments 1-12, wherein the p-type layer includes cadmium telluride.

Embodiment 14

The radiation detection device according to any of embodiments 1-13, wherein the radiation detection layer includes at least one of a scintillation layer and a neutron conversion layer.

Embodiment 15

The radiation detection device according to any of embodiments 1-14, wherein the transistor is a thin film transistor.

Embodiment 16

A method for fabricating a radiation detection device, the method comprising:
forming a first portion of a first polysilicon layer on a substrate, wherein the first portion of the first polysilicon layer is a cathode;
forming an n-type layer on the first portion of the first polysilicon layer;
forming a p-type layer on the n-type layer;
forming a metal layer on the p-type layer, wherein the metal layer is an anode;
forming a second polysilicon layer on the substrate;
forming a second portion of the first polysilicon layer above the second polysilicon layer;
forming a first layer on a first region of the second polysilicon layer;
forming a second layer on a second region of the second polysilicon layer; and forming a radiation detection layer above the substrate.

Embodiment 17

The method according to embodiment 16, wherein the second polysilicon layer is an active polysilicon island.

Embodiment 18

The method according to any of embodiments 16-17, wherein the second portion of the first polysilicon layer is a gate electrode.

Embodiment 19

The method according to any of embodiments 16-18, wherein the first layer is a source electrode.

Embodiment 20

The method according to any of embodiments 16-19, wherein the second layer is a drain electrode.

Embodiment 21

The method according to any of embodiments 16-20, wherein the active polysilicon island, and the gate, source, and drain electrodes form a transistor.

Embodiment 22

The method according to any of embodiments 16-21, wherein the radiation detection layer receives a plurality of radiations and generates a conversion output signal.

Embodiment 23

The method according to any of embodiments 16-22, wherein the photosensitive diode receives the conversion output signal and generates a detector signal.

Embodiment 24

The method according to any of embodiments 16-23, wherein the p-type and n-type layers, the anode, and the cathode form a photosensitive diode.

Embodiment 25

The method according to any of embodiments 16-24, wherein the n-type and p-type layers, the cathode, and the anode form a photosensitive diode.

Embodiment 26

The method according to any of embodiments 16-25, wherein the substrate includes at least one of polyethylene naphthalate, polyethylene terephthalate, a flexible aluminum foil, a flexible stainless steel sheet, and flexible glass.

Embodiment 27

The method according to any of embodiments 16-26, wherein the n-type layer includes cadmium sulfide.

Embodiment 28

The method according to any of embodiments 16-27, wherein the p-type layer includes cadmium telluride.

Embodiment 29

The method according to any of embodiments 16-28, wherein the radiation detection layer includes at least one of a scintillation layer and a neutron conversion layer.

Embodiment 30

The method according to any of embodiments 16-29, wherein the transistor is a thin film transistor.

While various embodiments of the present invention have been illustrated and described, it will be clear that the present invention is not limited to these embodiments only. Numerous modifications, changes, variations, substitutions, and equivalents will be apparent to those skilled in the art, without departing from the spirit and scope of the present invention, as described in the claims.

All patents, patent applications, provisional applications, and publications referred to or cited herein are incorporated by reference in their entirety, including all figures and tables, to the extent they are not inconsistent with the explicit teachings of this specification.

What is claimed is:

1. A radiation detection device, comprising:
   a first portion of a first polysilicon layer formed on a substrate, wherein the first portion of the first polysilicon layer is a cathode;
   an n-type layer formed on the first portion of the first polysilicon layer;
   a p-type layer formed on the n-type layer;
   a metal layer formed on the p-type layer, wherein the metal layer is an anode, and wherein the n-type and p-type layers, the cathode, and the anode form a photosensitive diode;
   a second polysilicon layer formed on the substrate, wherein the second polysilicon layer is an active polysilicon island;
   a second portion of the first polysilicon layer formed above the second polysilicon layer, wherein the second portion of the first polysilicon layer is a gate electrode;
   a first layer formed on a first region of the second polysilicon layer, wherein the first layer is a source electrode;
   a second layer formed on a second region of the second polysilicon layer, wherein the second layer is a drain electrode, and wherein the active polysilicon island, and the gate, source, and drain electrodes form a transistor; and
   a radiation detection layer formed above the substrate, wherein the radiation detection layer is configured to receive a plurality of radiations and generate a conversion output signal, wherein the photosensitive diode is configured to receive the conversion output signal and generate a detector signal, and wherein the transistor is configured to receive the detector signal and generate an amplified signal.

2. The radiation detection device according to claim 1, wherein the substrate includes at least one of polyethylene naphthalate, polyethylene terephthalate, a flexible aluminum foil, a flexible stainless steel sheet, and flexible glass.

3. The radiation detection device of claim 1, wherein the n-type layer includes cadmium sulfide.

4. The radiation detection device of claim 1, wherein the p-type layer includes cadmium telluride.

5. The radiation detection device of claim 1, wherein the radiation detection layer includes at least one of a scintillation layer and a neutron conversion layer.

6. The radiation detection device of claim 1, wherein the transistor is a thin film transistor.

7. A method for fabricating a radiation detection device, the method comprising:
   forming a first portion of a first polysilicon layer on a substrate, wherein the first portion of the first polysilicon layer is a cathode;
   forming an n-type layer on the first portion of the first polysilicon layer;
   forming a p-type layer on the n-type layer;
   forming a metal layer on the p-type layer, wherein the metal layer is an anode, and wherein the p-type and n-type layers, the anode, and the cathode form a photosensitive diode;
   forming a second polysilicon layer on the substrate, wherein the second polysilicon layer is an active polysilicon island;
   forming a second portion of the first polysilicon layer above the second polysilicon layer, wherein the second portion of the first polysilicon layer is a gate electrode;
   forming a first layer on a first region of the second polysilicon layer, wherein the first layer is a source electrode;
   forming a second layer on a second region of the second polysilicon layer, wherein the second layer is a drain electrode, and wherein the active polysilicon island, and the gate, source, and drain electrodes form a transistor; and
   forming a radiation detection layer above the substrate, wherein the radiation detection layer receives a plurality of radiations and generates a conversion output signal, wherein the photosensitive diode receives the conversion output signal and generates a detector signal, and wherein the transistor receives the detector signal and generates an amplified signal.

8. The method of claim 7, wherein the substrate includes at least one of polyethylene naphthalate, polyethylene terephthalate, a flexible aluminum foil, a flexible stainless steel sheet, and flexible glass.

9. The method of claim 7, wherein the n-type layer includes cadmium sulfide.

10. The method of claim 7, wherein the p-type layer includes cadmium telluride.

11. The method of claim 7, wherein the radiation detection layer includes at least one of a scintillation layer and a neutron conversion layer.

12. The method of claim 7, wherein the transistor is a thin film transistor.

13. The radiation detection device of claim 2, wherein the n-type layer includes cadmium sulfide.

14. The radiation detection device of claim 13, wherein the p-type layer includes cadmium telluride.

15. The radiation detection device of claim 14, wherein the radiation detection layer includes at least one of a scintillation layer and a neutron conversion layer.

16. The radiation detection device of claim 15, wherein the transistor is a thin film transistor.

17. The method of claim 8, wherein the n-type layer includes cadmium sulfide.

18. The method of claim 17, wherein the p-type layer includes cadmium telluride.

19. The method of claim 18, wherein the radiation detection layer includes at least one of a scintillation layer and a neutron conversion layer.

20. The method of claim 19, wherein the transistor is a thin film transistor.

\* \* \* \* \*